(12) United States Patent
Lu et al.

(10) Patent No.: US 8,716,858 B2
(45) Date of Patent: May 6, 2014

(54) BUMP STRUCTURE WITH BARRIER LAYER ON POST-PASSIVATION INTERCONNECT

(75) Inventors: Chen-Fa Lu, Kaohsiung (TW); Chung-Shi Liu, Hsinchu (TW); Mirng-Ji Lii, Sinpu Township (TW); Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 248 days.

(21) Appl. No.: 13/167,946

(22) Filed: Jun. 24, 2011

(65) Prior Publication Data
US 2012/0326298 A1    Dec. 27, 2012

(51) Int. Cl.
*H01L 23/48*    (2006.01)

(52) U.S. Cl.
USPC ............. 257/737; 257/751; 257/E21.021; 438/614

(58) Field of Classification Search
USPC ............. 257/734, 774, 737, 750–752, 738, 257/E23.021, E23.069, E23.068; 438/622, 438/107, 724, 10, 12, 17, 18, 624, 738, 740, 438/741, 744, 633, 671, 945, 975, 618
See application file for complete search history.

(56) References Cited

U.S. PATENT DOCUMENTS

| | | |
|---|---|---|
| 5,466,635 A | 11/1995 | Lynch et al. |
| 6,218,281 B1 | 4/2001 | Watanabe et al. |
| 6,229,220 B1 | 5/2001 | Saitoh et al. |
| 6,500,750 B1 * | 12/2002 | Shroff et al. .................. 438/622 |
| 6,578,754 B1 | 6/2003 | Tung |
| 6,592,019 B2 | 7/2003 | Tung |
| 6,818,545 B2 | 11/2004 | Lee et al. |
| 6,853,076 B2 | 2/2005 | Datta et al. |
| 6,917,119 B2 | 7/2005 | Lee et al. |
| 7,064,436 B2 | 6/2006 | Ishiguri et al. |
| 7,391,112 B2 | 6/2008 | Li et al. |
| 7,724,359 B2 * | 5/2010 | Amin et al. ................. 356/237.3 |
| 2002/0185733 A1 | 12/2002 | Chow et al. |
| 2006/0292851 A1 | 12/2006 | Lin et al. |
| 2007/0232051 A1 | 10/2007 | Wang et al. |
| 2008/0138624 A1 | 6/2008 | Lewis et al. |
| 2009/0115058 A1 * | 5/2009 | Yu et al. ........................ 257/738 |
| 2010/0041234 A1 | 2/2010 | Weigel et al. |
| 2010/0090318 A1 | 4/2010 | Hsu et al. |
| 2011/0049705 A1 | 3/2011 | Liu et al. |

FOREIGN PATENT DOCUMENTS

| | | |
|---|---|---|
| JP | 5-335313 | 12/1993 |
| JP | 2000-228420 | 8/2000 |

* cited by examiner

*Primary Examiner* — Julio J Maldonado
*Assistant Examiner* — Robert Bachner
(74) *Attorney, Agent, or Firm* — Lowe Hauptman & Ham, LLP

(57) ABSTRACT

A semiconductor device includes a barrier layer between a solder bump and a post-passivation interconnect (PPI) layer. The barrier layer is formed of at least one of an electroless nickel (Ni) layer, an electroless palladium (Pd) layer or an immersion gold (Au) layer.

20 Claims, 3 Drawing Sheets

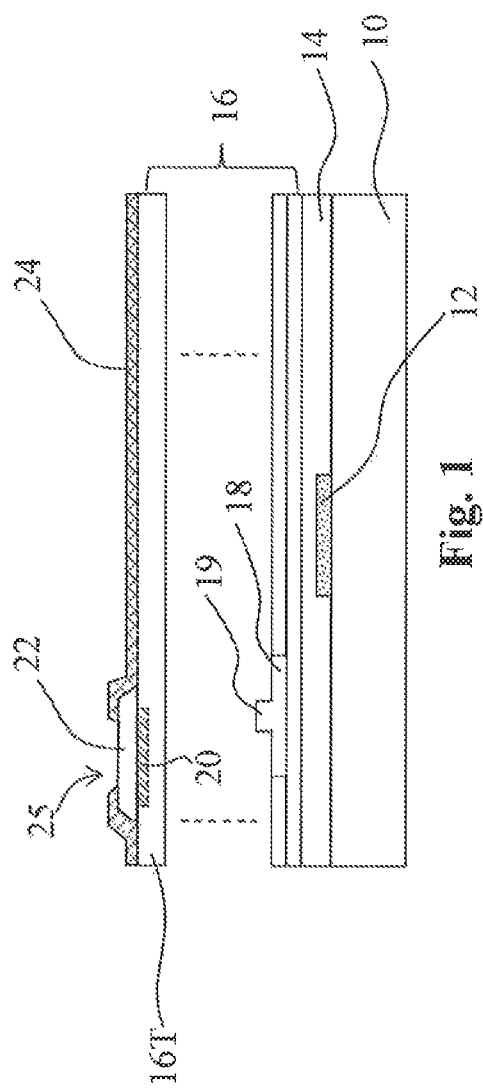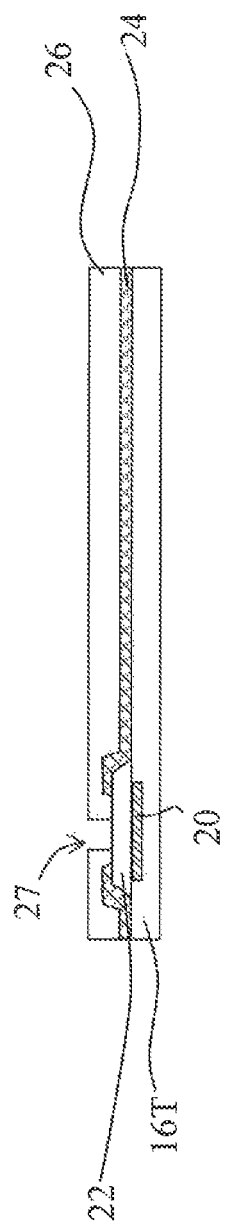

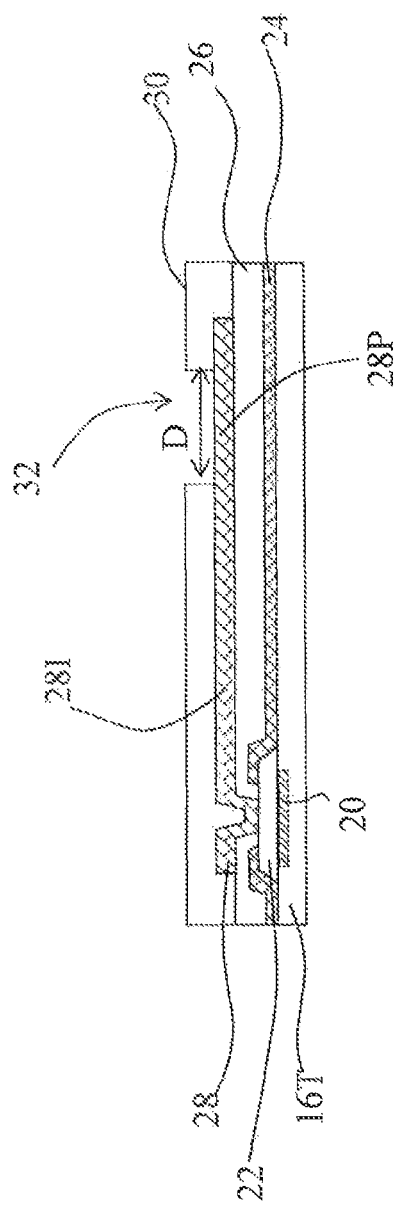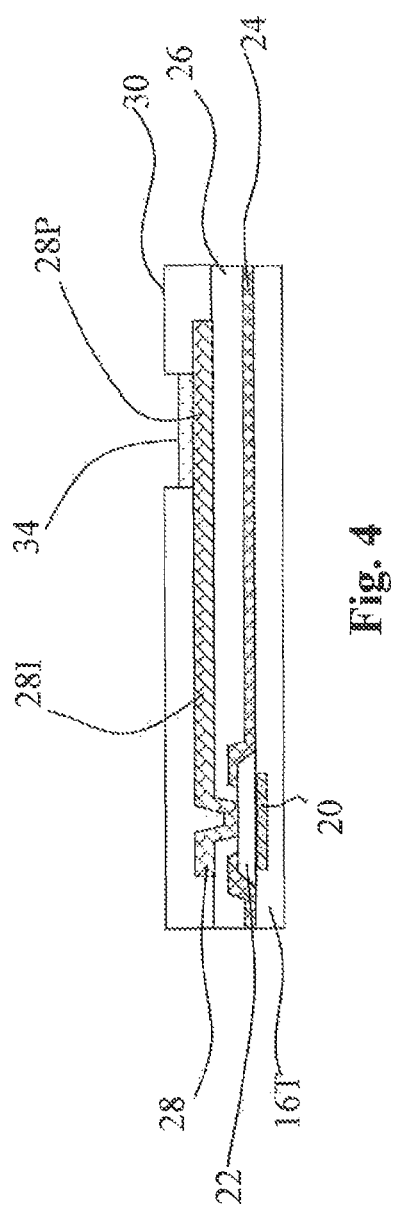

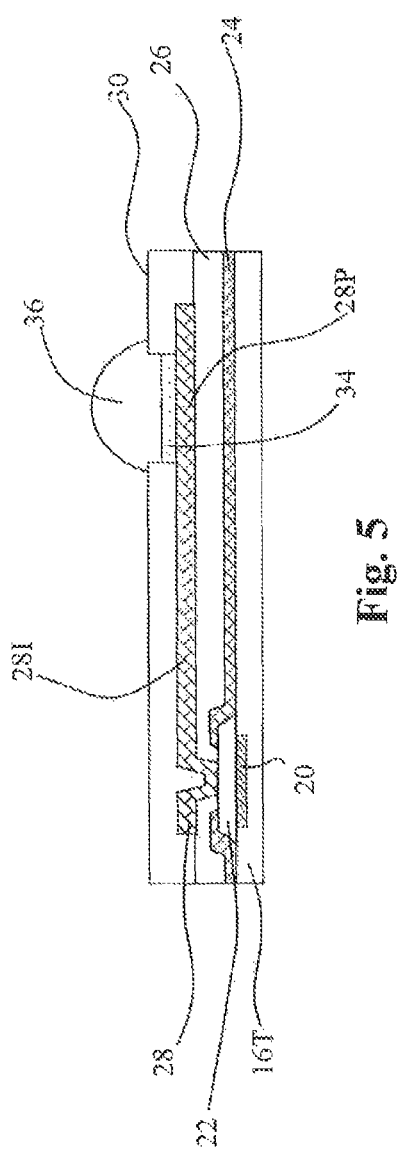
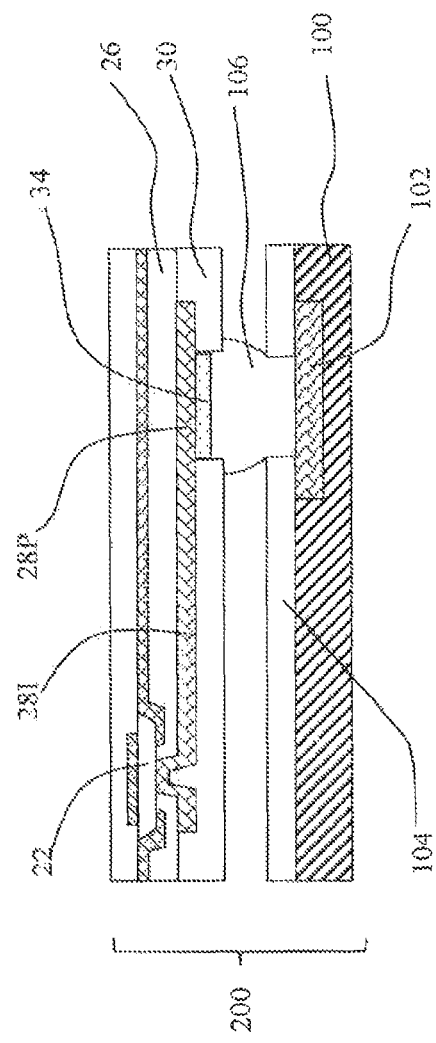

US 8,716,858 B2

BUMP STRUCTURE WITH BARRIER LAYER ON POST-PASSIVATION INTERCONNECT

RELATED APPLICATION

The present application is related to co-pending U.S. filing Ser. No. 12/907,249 filed on Oct. 19, 2010, which is expressly incorporated by reference herein in their entirety

TECHNICAL FIELD

This disclosure relates to the fabrication of semiconductor devices and, more particularly, to a bump structure in a semiconductor device.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package. Structurally, a bump actually contains the bump itself and an "under bump metallurgy" (UBM) located between the bump and an I/O pad.

Wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films and bumps. The known UBM formation processes require a physical vapor deposition (PVD) step, a metal plating step, or a combination of both to form metallization layers. Applying photoresist materials with photolithography and etching technologies are further required to define the UBM area for contacting the bump. The etching process, however, roughens the surface of the polymer film, which may induce residues after wafer backside grinding processes.

BRIEF DESCRIPTION OF THE DRAWINGS

FIGS. 1-5 are cross-sectional views of illustrating various intermediate stages of a method of forming a semiconductor device having a bump structure in accordance with an exemplary embodiment; and FIG. 6 is a cross-sectional view of a packaging assembly in accordance with an exemplary embodiment.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of bump structures for use with semiconductor devices. As will be discussed below, embodiments are disclosed that utilize a bump structure for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-4 illustrate various intermediate stages of a method of forming a bump structure in a semiconductor device in accordance with an embodiment. Referring first to FIG. 1, a portion of a substrate 10 having electrical circuitry 12 formed thereon is shown in accordance with an embodiment. The substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used.

Electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 14. The ILD layer 14 may be formed, for example, of a low-K dielectric material, such as phosphosilicate glass (PSG), borophosphosilicate glass (BPSG), fluorinated silicate glass (FSG) $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). It should also be noted that the ILD layer 14 may comprise a plurality of dielectric layers. Contacts (not shown) may be formed through the ILD layer 14 to provide an electrical contact to the electrical circuitry 12. The contacts may be formed of, for example, one or more layers of TaN, Ta, TiN, Ti, CoW, copper, tungsten, aluminum, silver, or the like, or combinations thereof.

One or more inter-metal dielectric (IMD) layers 16 and the associated metallization layers 18 are formed over the ILD layer 14. Generally, the one or more IMD layers 16 and the associated metallization layers (such as metal lines 18 and vias 19) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. It should be noted that one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In an embodiment, etch stop layers may be formed of SiN, SiCN, SiCO, CN, combinations thereof, or the like, deposited by CVD or PECVD techniques.

The metallization layers may be formed of copper or copper alloys, although they can also be formed of other metals. One skilled in the art will realize the formation details of the metallization layers. Further, the metallization layers include a top metal layer 20 formed and patterned in or on the uppermost IMD layer 16T to provide external electrical connections and to protect the underlying layers from various environmental contaminants. The uppermost IMD layer 16T may be formed of a dielectric material, such as silicon nitride, silicon oxide, undoped silicon glass, and the like. In subsequent drawings, semiconductor substrate 10, electrical circuitry 12, ILD layer 14, IMD layers 16, and metallization layers 18 and 19 are not illustrated. The top metal layer 20 is formed as a part of the top metallization layer on the uppermost IMD layer 16T.

Thereafter, a conductive pad 22 is formed and patterned to contact the top metal layer 20, or alternatively, electrically coupled to top metal layer 20 through a via. The conductive pad 22 may be formed of aluminum, aluminum copper, aluminum alloys, copper, copper alloys, or the like.

With reference to FIG. 1, one or more passivation layers, such as passivation layer 24, are formed and patterned over the conductive pads 22. The passivation layer 24 may be formed of a dielectric material, such as undoped silicate glass (USG), silicon nitride, silicon oxide, silicon oxynitride or a non-porous material by any suitable method, such as CVD, PVD, or the like. The passivation layer 24 is formed to cover the peripheral portion of the conductive pad 22, and to expose the central portion of conductive pad 22 through the opening 25 in passivation layer 24. The passivation layer 24 may be a single layer or a laminated layer. One of ordinary skill in the art will appreciate that a single layer of conductive pad and a passivation layer are shown for illustrative purposes only. As such, other embodiments may include any number of conductive layers and/or passivation layers.

FIG. 2 illustrates a first protective layer 26 formed and patterned over the passivation layer 24. The first protective layer 26 may be, for example, a polymer layer, which is patterned to form an opening 27, through which the conductive pad 22 is exposed. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods.

Thereafter, a post-passivation interconnect (PPI) line 28 is formed and patterned on the first protective layer 26 and fills the opening 27 to electrically connect the conductive pad 22 as shown in FIG. 3. The PPI line 28 includes an interconnect line region 28I and a landing pad region 28P. The interconnect line region 28I and the landing pad region 28P may be formed simultaneously, and may be formed of a same conductive material. A bump feature will be formed over and electrically connected to the landing pad region 28P in subsequent processes. The PPI line 28 may include, but not limited to, for example copper, aluminum, copper alloy, or other mobile conductive materials using plating, electroless plating, sputtering, chemical vapor deposition methods, and the like. In some embodiments, the PPI line 28 may further include a nickel-containing layer (not shown) on top of a copper-containing layer. In some embodiments, the PPI line 28 may also function as power lines, re-distribution lines (RDL), inductors, capacitors or any passive components. Through the routing of PPI line 28, the landing pad region 28P may be, or may not be, directly over the conductive pad 22.

With reference to FIG. 3, a second protective layer 30 is then formed on the substrate 10 to cover the PPI line 28 and the exposed portions of the first protective layer 26. Using photolithography and/or etching processes, the second protective layer 30 is further patterned to form an opening 32 exposing the landing pad region 28P of the PPI line 28. The formation methods of the opening 32 may include lithography, wet or dry etching, laser drill, and/or the like.

In one embodiment, the diameter D of the opening 32 is substantially equal to 20 μm. In another embodiment, the diameter D of the opening 32 is larger than 20 μm. In some embodiments, the second protective layer 30 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 30 is formed of a non-organic material selected from un-doped silicate glass (USG), silicon nitride, silicon oxynitride, silicon oxide, and combinations thereof.

In order to protect the exposed portion of the PPI line 28, the process proceeds to the formation of a barrier layer 34 within the opening 32. As shown in FIG. 4, a barrier layer 34 is formed on the landing pad region 28P within the opening 32 to prevent copper in the PPI line 28 from diffusing into bonding material, such as solder alloy, that is used to bond the substrate 10 to external features. The prevention of copper diffusion increases the reliability and bonding strength of the package. The barrier layer 34 may include nickel (Ni), tin, tin-lead (SnPb), gold (Au), silver, palladium (Pd), indium (In), nickel-palladium-gold (NiPdAu), nickel-gold (NiAu), a Ni-based alloy, an Au-based alloy, or a Pd-based alloy, other similar materials, or an alloy by an electroless plating process or an immersion plating process. The barrier layer 34 has a thickness about 0.1-10 μm. In one embodiment, the barrier layer 34 is a triple-layer structure including an electroless Ni layer, an electroless Pd layer, and an immersion Au layer, which is also known as an ENEPIG structure. For example, the ENEPIG structure may have the electroless Ni layer with a thickness of at least 2 μm, the electroless Pd layer with a thickness of at least 0.02 μm and the immersion Au layer with a thickness of at least 0.01 μm. In one embodiment, the barrier layer 34 is a dual-layer structure including an electroless Ni layer and an electroless Pd layer, named an ENEP structure. In one embodiment, the barrier layer 34 is a single-layer structure including an electroless Ni layer, which is also known as an EN structure. In one embodiment, the barrier layer 34 is a dual-layer structure including an electroless Ni layer and an immersion Au layer, which is also known as an ENIG structure.

As shown in FIG. 5, a solder bump 36 is formed on the barrier layer 34. In one embodiment, the solder bump 36 is formed by attaching a solder ball on the barrier layer 34 and then reflowing the material. The solder bump 36 may include a lead-free pre-solder layer, SnAg, or a solder material including alloys of tin, lead, silver, copper, nickel, bismuth, or combinations thereof. A bump structure is therefore completed on a semiconductor device.

The presented embodiments provide the barrier layer 34 as a protection film between the solder bump 36 and the landing pad region 28P to prevent copper in the PPI line 28 from diffusing into the solder material. The formation of the barrier layer 34 in the opening 32 uses electroless plating methods to provide an active area as the subsequent ball-drop window, which can replace the traditional under-bump metallization (UBM) layer. Compared with the known under-bump metallization (UBM) technologies, the above embodiments render photolithography, UBM etching and descum processes unnecessary for the barrier layer formation, and therefore the roughness of the polymer surface can be reduced and tape residues may be eliminated. This also simplifies the bump-formation process to reduce the process costs significantly. It has been found that the bump structure with the barrier layer 34 performs comparable with respect to shear force, and the stress and cracking of the passivation layer may be reduced and/or eliminated. Accordingly, in packaging assembly processes, joint reliability can be increased and bump fatigue can be reduced.

After the bump formation, for example, an encapsulant may be formed, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

FIG. 6 is a cross-sectional diagram depicting an exemplary embodiment of a flip-chip assembly. The structure shown in FIG. 5 is flipped upside down and attached to another substrate 100 at the bottom of FIG. 6. The substrate 100 may be a package substrate, board (e.g., a printed circuit board (PCB)), a wafer, a die, an interposer substrate, or other suitable substrate. The bump structure is coupled to the substrate 100 through various conductive attachment points. For example, a conductive region 102 is formed and patterned on the substrate 100. The conductive region 102 is a contact pad or a portion of a conductive trace, which is presented by a mask layer 104. In one embodiment, the mask layer 104 is a solder resist layer formed and patterned on the substrate 100 to expose the conductive region 102. The mask layer 104 has a mask opening, which provides a window for solder joint formation. For example, a solder layer including alloys of tin, lead, silver, copper, nickel, bismuth, or combinations thereof may be provided on the conductive region 102. The substrate 10 can be coupled to the substrate 100 to form a joint solder structure 106 between the barrier layer 34 and the conductive region 102. An exemplary coupling process includes a flux application, chip placement, reflowing of melting solder joints, and/or cleaning of flux residue. The integrated circuit substrate 10, the joint solder structure 106, and the other substrate 100 may be referred to as a packaging assembly 200, or in the present embodiment, a flip-chip packaging assembly.

In according with one aspect of the exemplary embodiment, a semiconductor device includes a semiconductor substrate, a passivation layer overlying the semiconductor substrate, and an interconnect layer overlying the passivation layer. The interconnect layer includes a line region and a landing pad region. A protective layer overlies the interconnect layer and exposes the landing pad region of the interconnect layer. A barrier layer is formed on the exposed portion of the pad region, and a solder bump formed on the barrier layer. The barrier layer is formed of at least one of a nickel (Ni) layer, a palladium (Pd) layer and a gold (Au) layer.

In accordance with another aspect of the exemplary embodiment, a packaging assembly includes a semiconductor device connected by a joint to a substrate. The semiconductor device includes a post-passivation interconnect (PPI) layer having a line region and a landing pad region, a polymer layer covering the line region of the PPI layer and exposing the landing pad region of the PPI layer, and a barrier layer on the exposed landing pad region of the PPI layer. The substrate includes a conductive region. A joint solder structure is formed between the barrier layer of the semiconductor device and the conductive region of the substrate. The barrier layer is formed of at least one of a nickel (Ni) layer, a palladium (Pd) layer and a gold (Au) layer.

In accordance with the other aspect of the exemplary embodiment, a method of forming a semiconductor device includes the following steps: forming a passivation layer overlying a semiconductor substrate; forming an interconnect layer overlying the passivation layer, forming a protective layer overlying the interconnect layer; forming an opening in the protective layer to expose a landing pad region of the interconnect layer; forming a barrier layer on the pad region within the opening of the protective layer by an electroless plating process or an immersion plating process; and forming a solder bump on the barrier layer. The barrier layer is formed of at least one of a nickel (Ni) layer, a palladium (Pd) layer and a gold (Au) layer.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device, comprising:
   a semiconductor substrate;

a passivation layer overlying the semiconductor substrate;
an interconnect layer overlying at least a portion of a top surface of the passivation layer, comprising a line region and a landing pad region;
a protective layer overlying at least a portion of a top surface of the interconnect layer and exposing the landing pad region of the interconnect layer;
a barrier layer formed on the exposed portion of the landing pad region; and
a solder bump formed in contact with the barrier layer and the protective layer;
wherein the barrier layer comprises at least one of a nickel (Ni) layer, a palladium (Pd) layer or a gold (Au) layer.

2. The semiconductor device of claim 1, wherein the interconnect layer comprises copper.

3. The semiconductor device of claim 1, wherein the barrier layer is an electroless Ni/electroless Pd/immersion Au (ENEPIG) structure.

4. The semiconductor device of claim 1, wherein the barrier layer is an electroless Ni/electroless Pd (ENEP) structure.

5. The semiconductor device of claim 1, wherein the barrier layer is an electroless Ni/immersion Au (ENIG) structure.

6. The semiconductor device of claim 1, wherein the protective layer comprises a polymer layer.

7. The semiconductor device of claim 1, wherein the protective layer has an opening exposing the landing pad region and the opening has a diameter equal to or larger than 20 μm.

8. The semiconductor device of claim 7, wherein the barrier layer is formed within the opening of the protective layer.

9. The semiconductor device of claim 7, further comprising another protective layer between the interconnect layer and the passivation layer.

10. The semiconductor device of claim 1, wherein the semiconductor substrate comprises a conductive pad which is partially covered by the passivation layer and electrically connected to the line region of the interconnect layer.

11. A packaging assembly, comprising:
a semiconductor device comprising:
    a post-passivation interconnect (PPI) layer over a passivation layer, the PPI layer comprising a line region and a landing pad region;
    a polymer layer covering the line region of the PPI layer and exposing the landing pad region of the PPI layer; and
    a barrier layer on the exposed landing pad region of the PPI layer;
a substrate comprising a conductive region; and
a joint solder structure between the barrier layer of the semiconductor device and the conductive region of the substrate, the joint solder structure contacting the polymer layer and the barrier layer of the semiconductor device;
wherein the barrier layer comprises at least one of a nickel (Ni) layer, a palladium (Pd) layer or a gold (Au) layer.

12. The packaging assembly of claim 11, wherein the interconnect layer comprises copper.

13. The packaging assembly of claim 11, wherein the barrier layer is an electroless Ni/electroless Pd/immersion Au (ENEPIG) structure.

14. The packaging assembly of claim 11, wherein the barrier layer is an electroless Ni/electroless Pd (ENEP) structure.

15. The packaging assembly of claim 11, wherein the barrier layer is an electroless Ni/immersion Au (ENIG) structure.

16. The packaging assembly of claim 11, wherein the polymer layer has an opening exposing the landing pad region, and the opening has a diameter equal to or larger than 20 μm.

17. A method of forming a semiconductor device, comprising:
providing a semiconductor substrate;
forming a passivation layer overlying the semiconductor substrate;
forming an interconnect layer overlying at least a portion of a top surface of the passivation layer, comprising a line region and a landing pad region;
forming a protective layer overlying at least a portion of a top surface of the interconnect layer
forming an opening in the protective layer to expose the landing pad region of the interconnect layer;
forming a barrier layer on the pad region within the opening of the protective layer by an electroless plating process or an immersion plating process; and
forming a solder bump in contact with the barrier layer and the protective layer;
wherein the barrier layer comprises at least one of a nickel (Ni) layer, a palladium (Pd) layer or a gold (Au) layer.

18. The method of claim 17, wherein the forming of a solder bump comprises attaching a solder ball on the barrier layer.

19. The method of claim 17, wherein the diameter of the opening is equal to or larger than 20 μm.

20. The method of claim 17, wherein the barrier layer comprises at least one of an electroless nickel (Ni) layer, an electroless palladium (Pd) layer or an immersion gold (Au) layer.

* * * * *